United States Patent
Kawahara et al.

(10) Patent No.: US 11,698,580 B2
(45) Date of Patent: Jul. 11, 2023

(54) REFLECTIVE MASK BLANK FOR EUV LITHOGRAPHY

(71) Applicant: AGC Inc., Tokyo (JP)

(72) Inventors: Hirotomo Kawahara, Tokyo (JP); Hiroyoshi Tanabe, Tokyo (JP); Toshiyuki Uno, Koriyama (JP); Hiroshi Hanekawa, Koriyama (JP); Daijiro Akagi, Tokyo (JP)

(73) Assignee: AGC INC., Tokyo (JP)

( * ) Notice: Subject to any disclaimer, the term of this patent is extended or adjusted under 35 U.S.C. 154(b) by 253 days.

(21) Appl. No.: 17/235,220

(22) Filed: Apr. 20, 2021

(65) Prior Publication Data

US 2021/0325772 A1   Oct. 21, 2021

(30) Foreign Application Priority Data

Apr. 21, 2020   (JP) ................................. 2020-075286

(51) Int. Cl.
*G03F 1/24*   (2012.01)

(52) U.S. Cl.
CPC ..................................... *G03F 1/24* (2013.01)

(58) Field of Classification Search
CPC ........................................................ G03F 1/24
USPC ............................................................ 430/5
See application file for complete search history.

(56) References Cited

FOREIGN PATENT DOCUMENTS

JP              5266988 B2     8/2013

*Primary Examiner* — Christopher G Young
(74) *Attorney, Agent, or Firm* — Foley & Lardner LLP

(57) ABSTRACT

A reflective mask blank for EUV lithography includes a substrate, a reflective layer for reflecting EUV light, and an absorption layer for absorbing EUV light. The reflective layer and the absorption layer are formed on or above the substrate in this order. The absorption layer contains tantalum (Ta) and niobium (Nb), and the absorption layer has a composition ratio Ta:Nb of Ta (at %) to Nb (at %) of from 4:1 to 1:4. Among diffraction peaks derived from the absorption layer observed at 2θ: from 20° to 50° by out-of-plane XRD method, a peak having the highest intensity has a half width FWHM of 1.0° or more.

17 Claims, 1 Drawing Sheet

US 11,698,580 B2

REFLECTIVE MASK BLANK FOR EUV LITHOGRAPHY

TECHNICAL FIELD

This application is based on Japanese Patent Application No. 2020-075286 filed on Apr. 21, 2020, the entire subject matter of which is incorporated herein by reference.

The present invention relates to a reflective mask blank for EUV (Extreme Ultra Violet) lithography (in the present description, hereinafter referred to as "EUV mask blank") used for semiconductor production, etc.

BACKGROUND ART

Conventionally, in the semiconductor industry, a photolithography method using visible light or ultraviolet light has been employed as a technique for transferring a fine pattern required to form an integrated circuit with a fine pattern on a Si substrate, etc. However, miniaturization of a semiconductor device has been accelerated, and on the other hand, the conventional photolithography method is approaching its limit. In the case of the photolithography method, the resolution limit of a pattern is about ½ of the exposure wavelength. Even if an immersion method is used, the resolution limit is said to be about ¼ of the exposure wavelength, and even if an immersion method with an ArF laser (193 nm) is used, the limit is estimated to be approximately from 20 nm to 30 nm. From this point of view, EUV lithography, which is an exposure technique using EUV light having a wavelength further shorter than ArF laser, is expected to be promising as an exposure technique for 20 nm to 30 nm and generations that follow. In this description, the EUV light indicates a ray having a wavelength in a soft X-ray range or a vacuum ultraviolet range, specifically, a ray having a wavelength of approximately from 10 nm to 20 nm, particularly about 13.5 nm±0.3 nm.

EUV light is readily absorbed by various kinds of substances, and the refractive index of the substance at such a wavelength is close to 1. Therefore, a refractive optical system such as conventional photolithography using visible light or ultraviolet light cannot be employed. For this reason, in the EUV lithography, a catoptric system, i.e., a system using a reflective photomask and a mirror, is employed.

On the other hand, separately from shortening of the wavelength of light, resolution-enhancing techniques utilizing a phase shift mask have been proposed. In the phase shift mask, a transmission area of a mask pattern is formed using a different substance or shape from an adjacent transmission area to thereby give a 180° phase difference to light having passed through the transmission areas. Consequently, transmitted and diffracted light beams having a 180° phase difference cancel each other in a region between two transmission areas to significantly reduce the light intensity and in turn, enhance the mask contrast. As a result, the focal depth at the time of transfer increases and the transfer accuracy is enhanced. The phase difference is best at 180° in principle, but when it is substantially on the order of 175° to 185°, the resolution-enhancing effect is sufficiently obtained.

A halftone mask is a kind of a phase shift mask and is a phase shift mask in which as for the material constituting the mask pattern, a thin film semi-transmissive to exposure light is used as an absorption layer and a phase difference of approximately from 175° to 185° relative to normal substrate-transmitted light is imparted while attenuating the transmittance to several % (usually, approximately from 2.5% to 15.0% relative to substrate-transmitted light), thereby increasing the resolution in the pattern edge part and enhancing the transfer accuracy.

Here, the proper range of the transmittance in a halftone mask is described. In the conventional halftone mask for excimer laser, it is preferable to satisfy an optical condition that the transmittance of an absorption layer for ultraviolet light having an exposure wavelength is generally from 2.5% to 15.0%. The reason therefor is that, first of all, if the transmittance of the absorption layer at the exposure wavelength is less than 2.5%, when diffracted light beams of light having passed through adjacent transmission pattern areas are overlapped, the cancelling effect is small. On the other hand, if the transmittance exceeds 15.0%, the resolution limit of the resist is surpassed depending on exposure conditions, and an extra pattern is formed in a region where light has passed through the absorption layer.

In the EUV exposure, a catoptric system is used and since the NA (numerical aperture) is small and the wavelength is short, as a specific problem, the exposure is susceptible to unevenness of a mirror or mask surface, making it difficult to resolve a target fine line width with good accuracy. To cope with this difficulty, a halftone EUV mask enabling the principle of the halftone mask used in conventional excimer laser exposure to be applied also to EUV exposure has been proposed (see, for example, Patent Literature 1).

The principle of enhancing the resolution by a phase shift effect is the same as well in a reflective mask such as EUV mask. Therefore, except that the "transmittance" above is simply replaced by "reflectance", appropriate values are substantially the same. More specifically, it is thought that the reflectance of EUV light in the absorption layer is preferably from 2.5% to 15.0%, because a width (flexibility) of the selection for reflectance when the phase difference between reflected light of EUV light from the reflection layer and reflected light of EUV light from the absorption layer is from 175° to 185° (hereinafter, in the present description, referred to as "in phase difference of 175° to 185°") is broadened.

In principle, use of the halftone EUV mask is an effective means to enhance the resolution in EUV lithography. However, the optimal transmittance in the halftone EUV mask depends on exposure conditions or a pattern transferred and can hardly be determined unconditionally.

For these reasons, the absorption layer in the halftone EUV mask is required to be a film allowing a width (flexibility) of the selection for reflectance at a phase difference of 175° to 185° and being easy to etch.

In the invention described in Patent Literature 1, it is stated that a material including Ta (tantalum) and Nb (niobium) is selected as the material of the absorption layer to thereby provide a width (flexibility) of the selection for reflectance and increase the processing accuracy in etching.
Patent Literature 1: Japanese Patent No. 5,266,988

SUMMARY OF INVENTION

However, a compound of Ta and Nb has high crystallinity and its use as the material of the absorption layer has been found to have a problem that, for example, the film has large surface roughness or the line edge roughness (LER) after patterning is large.

On the other hand, in a binary EUV mask, it is known that when a nitride such as TaN or TaBN is used in the absorption layer, the film structure is amorphized, but since the reflectance for EUV light is as low as less than 2.0%, the nitride is inappropriate for the absorption layer of the halftone EUV mask.

For solving the above-described problems of background arts, an object of the present invention is to provide an EUV mask blank suitable for a halftone EUV mask, including an absorption layer allowing not only a width (flexibility) of the selection for reflectance at a phase difference of 175° to 185° but also ease of etching and having high smoothness on its surface.

In order to attain the object above, the present inventors provide a reflective mask blank for EUV lithography, including a substrate, a reflective layer for reflecting EUV light, and an absorption layer for absorbing EUV light, the reflective layer and the absorption layer formed on or above the substrate in this order, wherein the absorption layer contains tantalum (Ta) and niobium (Nb), and the absorption layer has a composition ratio Ta:Nb of Ta (at %) to Nb (at %) of from 4:1 to 1:4, and wherein among diffraction peaks derived from the absorption layer observed at 2θ: from 20° to 50° by out-of-plane XRD method, a peak having the highest intensity has a half width FWHM of 1.0° or more.

The EUV mask blank of the present invention includes an absorption layer allowing not only a width (flexibility) of the selection for reflectance at a phase difference of 175° to 185° but also ease of etching and having high smoothness on its surface. Therefore, is suitable for a halftone EUV mask.

DESCRIPTION OF EMBODIMENTS

Figure 1:
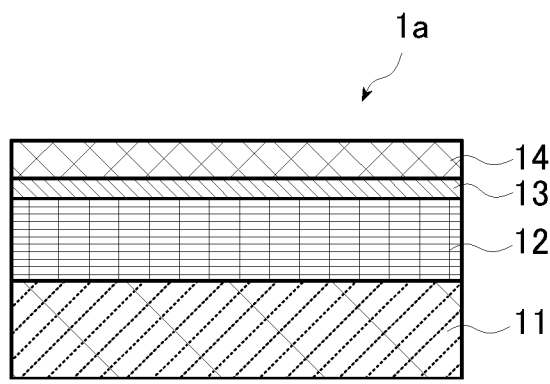
FIG. 1 is a schematic cross-sectional diagram illustrating one embodiment of the EUV mask blank of the present invention.

The EUV mask blank of the present invention is described below by referring to the drawings.

FIG. 1 is a schematic cross-sectional diagram illustrating one embodiment of the EUV mask blank of the present invention. In the EUV mask blank 1a illustrated in FIG. 1, a reflective layer 12 reflecting EUV light, a protective layer 13 for the reflective layer 12, and an absorption layer 14 absorbing EUV light are formed in this order on or above a substrate 11 from the substrate side. In the configuration illustrated in FIG. 1 of the EUV mask blank of the present invention, only the substrate 11, the reflective layer 12, and the absorption layer 14 are essential, and the protective layer 13 is an optional constituent element.

The protective layer 13 for the reflective layer 12 is a layer provided with the purpose of protecting the reflective layer 12 at the time of forming a pattern of the absorption layer 14.

Respective constituent elements of the EUV mask blank 1a are described below.

The substrate 11 satisfies the properties as a substrate for the EUV mask blank. Therefore, the substrate 11 has a low coefficient of thermal expansion (specifically, the coefficient of thermal expansion at 20° C. is preferably $0\pm0.05\times10^{-7}$° C., more preferably $0\pm0.03\times10^{-7}$° C.) and is excellent in smoothness, flatness and resistance to a cleaning liquid used for cleaning, etc. of a mask blank or a photomask after pattern formation. As the substrate 11, specifically, a glass having a low coefficient of thermal expansion, for example, a $SiO_2$—$TiO_2$ glass, is used, but the substrate 11 is not limited thereto, and a substrate such as crystallized glass in which β-quartz solid solution is precipitated, silica glass, silicon, metal, etc. can also be used.

The substrate 11 preferably has a smooth surface with a surface roughness (rms) of 0.15 nm or less and a flatness of 100 nm or less, because high reflectance and transfer accuracy are obtained in a photomask after pattern formation.

The size, thickness, etc. of the substrate 11 are appropriately determined according to designed values, etc. of the mask. In Examples described later, a $SiO_2$—$TiO_2$ glass having an outer dimension of 6 inch (152 mm) square and a thickness of 0.25 inch (6.3 mm) was used.

It is preferred that no defect exists in the surface of the substrate 11 on which the reflective layer 12 is formed. However, a defect may exist as long as a phase defect is not caused due to a concave defect and/or a convex defect. Specifically, it is preferred that the depth of a concave defect and the height of a convex defect are 2 nm or less and the half widths of these concave and convex defects are 60 nm or less. The half width of the concave defect indicates a width at a position of ½ of the depth of the concave defect. The half width of the convex defect indicates a width at a position of ½ of the height of the convex defect.

The reflective layer 12 is not particularly limited as long as it has desired properties as a reflective layer of the EUV mask blank. The property particularly required for the reflective layer 12 is a high EUV light ray reflectance. Specifically, when the reflective layer 12 surface is irradiated with light rays in a wavelength range of EUV light at an incident angle of 6°, the maximum value of the reflectance for light having wavelength of around 13.5 nm is preferably 60% or more, more preferably 65% or more. Also, even in the case of providing a protective layer 13 on the reflective layer 12, the maximum value of the reflectance for light having wavelength of around 13.5 nm is preferably 60% or more, more preferably 65% or more.

As the reflective layer 12, a multilayer reflective film formed by alternately stacking a high-refractive-index layer and a low-refractive-index layer a plurality of times is usually used, because a high EUV light ray reflectance can be achieved. In the multilayer reflective film serving as the reflective layer 12, Mo is widely used for the high-refractive-index layer, and Si is widely used for the low-refractive-index layer. That is, a Mo/Si multilayer reflective film is most common. However, the multilayer reflective film is not limited thereto, and a Ru/Si multilayer reflective film, a Mo/Be multilayer reflective film, a Mo compound/Si compound multilayer reflective film, a Si/Mo/Ru multilayer reflective film, a Si/Mo/Ru/Mo multilayer reflective film, and a Si/Ru/Mo/Ru multilayer reflective film may also be used.

The film thickness of each layer constituting the multilayer reflective film serving as the reflective layer 12 and the number of repeating layer units can be appropriately selected according to film materials used and the EUV light ray reflectance required for the reflective layer. Taking a Mo/Si reflective film as an example, in order to form a reflective layer 12 having a maximum value of EUV light ray reflectance of 60% or more, the multilayer reflective film is formed by stacking a Mo layer with a film thickness of 2.3±0.1 nm and a Si layer with a film thickness 4.5±0.1 nm such that the number of repeating units becomes from 30 to 60.

Each layer constituting the multilayer reflective film serving as the reflective layer 12 may be deposited to have a desired thickness by use of a deposition method such as magnetron sputtering method or ion beam sputtering method. For example, in the case of forming a Si/Mo multilayer reflective film by use of an ion beam sputtering method, it is preferred that a Si film is deposited to have a thickness of 4.5 nm at an ion accelerating voltage of 300 V to 1,500 V and a deposition rate of 0.030 nm/sec to 0.300 nm/sec by using a Si target as the target and an Ar gas (gas pressure: from $1.3 \times 10^{-2}$ Pa to $2.7 \times 10^{-2}$ Pa) as the sputtering gas and subsequently, a Mo film is deposited to have a thickness of 2.3 nm at an ion accelerating voltage of 300 V to 1,500 V and a deposition rate of 0.030 nm/sec to 0.300 nm/sec by using a Mo target as the target and an Ar gas (gas pressure: from $1.3 \times 10^{-2}$ Pa to $2.7 \times 10^{-2}$ Pa) as the sputtering gas. Taking these operations as one cycle, the Si film and the Mo film are stacked in 40 cycles to 50 cycles, and a Si/Mo multilayer reflective film is thereby deposited.

In order to prevent oxidation of the reflective layer 12 surface, the uppermost layer of the multilayer reflective film serving as the reflective layer 12 is preferably a layer formed of a material resistant to oxidation. The layer formed of a material resistant to oxidation functions as a cap layer for the reflective layer 12. Specific examples of the layer formed of a material resistant to oxidation and functioning as a cap layer include a Si layer. In the case where the multilayer reflective film serving as the reflective layer 12 is a Si/Mo multilayer reflective film, when the uppermost layer is a Si layer, the uppermost layer functions as a cap layer. In this case, the film thickness of the cap layer is preferably 11±2 nm.

The protective layer 13 is provided for the purpose of protecting the reflective layer 12 so that the reflective layer 12 is not damaged by an etching process at the time of forming a pattern on the absorption layer 14 by an etching process, usually by a dry etching process. Accordingly, as the material of the protective layer, a material which is less affected by the etching process of the absorption layer 14, i.e., which has an etching rate slower than the absorption layer 14 and is less likely damaged by the etching process, is selected. In order to satisfy these properties, the protective layer 13 is preferably composed of a material containing ruthenium (Ru). Specific examples of the material containing Ru include Ru and a Ru compound (e.g., RuB, RuSi, RuNb, RuTi, RuY, RuZr, RuLa). The material containing Ru is preferably a material containing, in the material, 40.0 at % or more, more preferably 50.0 at % or more, still more preferably 55.0 at % or more, of Ru.

The thickness of the protective layer 13 is preferably from 1 nm to 20 nm, more preferably from 1 nm to 5 nm.

The protective layer 13 is deposited using a deposition method such as magnetron sputtering method or ion beam sputtering method. In the case of depositing a Ru film by a magnetron sputtering method, the film is preferably deposited to have a thickness of 2 nm to 5 nm at an input voltage of 30 V to 1,500 V and a deposition rate of 0.020 nm/sec to 1.000 nm/sec by using a Ru target as the target and an Ar gas (gas pressure: from $1.0 \times 10^{-2}$ Pa to $1.0 \times 10^{0}$ Pa) as the sputtering gas.

As described above, the absorption layer in the halftone EUV mask is required to allow a width (flexibility) of the selection for reflectance at a phase difference of 175° to 185°, be easy to etch and have high smoothness on its surface.

In the EUV mask blank 1a of the present invention, the absorption layer 14 contains tantalum (Ta) and niobium (Nb), and the composition ratio (Ta:Nb) of Ta (at %) to Nb (at %) in the absorption layer 14 as measured by Rutherford backscattering spectrometry (RBS) is from 4:1 to 1:4. The absorption layer 14 having this composition allows a width (flexibility) of the selection for reflectance at a phase difference of 175° to 185° and ensures high processing accuracy for etching. If the content of Nb is larger than the composition ratio (Ta:Nb) of 1:4, the extinction coefficient k of the EUV optical constant decreases, and EUV reflectance excessively increases, as a result, a sufficient effect as the absorption layer of a halftone EUV mask is not obtained as well as the resistance to a cleaning liquid of the absorption layer is reduced.

On the other hand, if the content of Ta is larger than the composition ratio (Ta:Nb) of 4:1, the extinction coefficient k of the EUV optical constant increases, and EUV reflectance excessively decreases, as a result, a sufficient effect as the absorption layer of a halftone EUV mask is not obtained.

The composition ratio (Ta:Nb) of Ta to Nb in the absorption layer 14 is preferably from 3:1 to 1:3, more preferably from 7:3 to 3:7.

In the absorption layer of a halftone EUV mask, it is preferred that the refractive index n of the EUV optical constant is from 0.935 to 0.963 and the extinction coefficient k is from 0.008 to 0.030.

In the EUV mask blank 1a of the present invention, not only the absorption layer 14 has the above-described composition but also among diffraction peaks derived from the absorption layer observed at 2θ: 20° to 50° by out-of-plane XRD method, the peak having highest intensity has a half width FWHM (in the present description, hereinafter, referred to as half width FWHM) of 1.0° or more. This leads to reducing the crystallinity and increasing the smoothness of the absorption layer 14 surface.

Specifically, the surface roughness (rms) of the absorption layer 14 surface is preferably 0.50 nm or less, more preferably 0.40 nm or less, still more preferably 0.30 nm or less.

In the absorption layer 14 of the present invention, the half width FWHM is preferably 2.0° or more, more preferably 3.0° or more. In the absorption layer 14 of the present invention, the half width FWHM is preferably 8.0° or less, more preferably 6.0° or less, still more preferably 5.0° or less.

The absorption layer 14 having a half width FWHM of 1.0° or more can also be obtained by controlling the deposition conditions at the time of formation of the absorption layer 14.

For example, the layer can be obtained by conducting at least one control selected from the group consisting of more increasing the gas pressure, more decreasing the input power, and more increasing the distance between the sputtering target and the substrate.

In the EUV mask blank 1a of the present invention, an absorption layer having a half width FWHM of 1.0° or more is also obtained when the absorption layer 14 further contains, in addition to Ta and Nb, a predetermined amount of at least one selected from the group consisting of hydrogen (H), boron (B), nitrogen (N) and oxygen (O).

In the case where the absorption layer 14 contains B, when the B content in the absorption layer is 5.0 at % or more, an absorption layer having a half width FWHM of 1.0° or more is obtained. However, if the B content in the absorption layer is too large, the resistance to a cleaning liquid of the absorption layer decreases, and therefore, the content is preferably 20.0 at % or less.

The B content in the absorption layer is preferably from 7.0 at % to 15.0 at %, more preferably from 8.0 at % to 12.0 at %.

In the case where the absorption layer 14 contains N, when the N content in the absorption layer is 10.0 at % or more, an absorption layer having a half width FWHM of 1.0° or more is obtained. However, if the N content in the absorption layer is too large, the resistance to a cleaning liquid of the absorption layer decreases, and therefore, the content is preferably 35.0 at % or less.

The N content in the absorption layer is preferably from 15.0 at % to 30.0 at %, more preferably from 20.0 at % to 25.0 at %.

In the case where the absorption layer 14 contains H, when the H content in the absorption layer is 0.1 at % or more, an absorption layer having a half width FWHM of 1.0° or more is obtained. However, if the H content in the absorption layer is too large, the resistance to a cleaning liquid of the absorption layer decreases, and therefore, the content is preferably 15.0 at % or less, more preferably 13.0 at % or less.

The H content in the absorption layer is preferably from 0.1 at % to 10.0 at %, more preferably from 0.1 at % to 8.0 at %.

In the case where the absorption layer 14 contains O, when the O content in the absorption layer is 1.0 at % or more, an absorption layer having a half width FWHM of 1.0° or more is obtained. However, if the O content in the absorption layer is too large, there are the following problems. Like the absorption layer 14, the etching of an absorption layer containing Ta is executed by performing, in order, dry etching using a fluorine gas and dry etching using an oxygen gas-free chlorine gas. If the O content in the absorption layer is too large, the etching rate in dry etching using an oxygen-free chlorine gas decreases rapidly. For this reason, the O content in the absorption layer is preferably 20.0 at % or less.

The O content in the absorption layer is preferably from 2.0 at % to 15.0 at %, more preferably from 5.0 at % to 10.0 at %.

In the case where the absorption layer 14 contains two or more selected from the group consisting of H, B, N and O, when the content of each of those two or more elements in the absorption layer is in the range above, an absorption layer having a half width FWHM of 1.0° or more is obtained, and the resistance to a cleaning liquid of the absorption layer is improved.

The absorption layer 14 further containing, in addition to Ta and Nb, at least one selected from the group consisting of H, B, N and O can be formed by a deposition method, for example, by a magnetron sputtering method or an ion beam sputtering method.

In the case of forming an absorption layer containing Ta, Nb and B by a sputtering method, a sputtering method using a Ta target, an Nb target and a B target, a sputtering method using a target containing Ta, Nb and B, a sputtering method using a target containing Ta and Nb, a sputtering method using a B target, a sputtering method using a target containing Ta and B and an Nb target, or a sputtering method using a target containing Ta and a target containing Nb and B may be conducted in an inert gas atmosphere. In the case of using a magnetron sputtering method, the method may be conducted, specifically, under the following deposition conditions.

Sputtering gas: Ar gas (gas pressure: from $1.0 \times 10^{-1}$ Pa to $50 \times 10^{-1}$ Pa, preferably from $1.0 \times 10^{-1}$ Pa to $40 \times 10^{-1}$ Pa, more preferably from $1.0 \times 10^{-1}$ Pa to $30 \times 10^{-1}$ Pa)

Deposition rate: from 2.0 nm/min to 60.0 nm/min, preferably from 3.5 nm/min to 45.0 nm/min, more preferably from 5 nm/min to 30.0 nm/min Input power density per target area: from 0.3 W/cm² to 13.0 W/cm², preferably from 0.6 W/cm² to 12.0 W/cm², more preferably from 1.0 W/cm² to 10.0 W/cm²

Distance between target and substrate: from 50 mm to 500 mm, preferably from 100 mm to 400 mm, more preferably from 150 mm to 300 mm In the case of forming an absorption layer containing Ta, Nb and N by a sputtering method, a sputtering method using a Ta target and an Nb target, or a sputtering method using a target containing Ta and Nb may be conducted in an atmosphere containing an inert gas and $N_2$. In the case of using a magnetron sputtering method, the method may be conducted, specifically, under the following deposition conditions.

Sputtering gas: A mixed gas of Ar and $N_2$ ($N_2$ gas concentration: from 1.0 vol % to 80.0 vol %, preferably from 2.0 vol % to 75.0 vol %, more preferably from 3.0 vol % to 70.0 vol %; gas pressure: from $1.0 \times 10^{-1}$ Pa to $50 \times 10^{-1}$ Pa, preferably from $1.0 \times 10^{-1}$ Pa to $40 \times 10^{-1}$ Pa, more preferably from $1.0 \times 10^{-1}$ Pa to $30 \times 10^{-1}$ Pa)

Deposition rate: from 2.0 nm/min to 60.0 nm/min, preferably from 3.5 nm/min to 45.0 nm/min, more preferably from 5.0 nm/min to 30.0 nm/min Input power density per target area: from 0.3 W/cm² to 13.0 W/cm², preferably from 0.6 W/cm² to 12.0 W/cm², more preferably from 1.0 W/cm² to 10.0 W/cm²

Distance between target and substrate: from 50 mm to 500 mm, preferably from 100 mm to 400 mm, more preferably from 150 mm to 300 mm In the case of forming an absorption layer containing Ta, Nb and H by a sputtering method, a sputtering method using a Ta target and an Nb target, or a sputtering method using a target containing Ta and Nb may be conducted in an atmosphere containing an inert gas and $H_2$. In the case of using a magnetron sputtering method, the method may be conducted, specifically, under the following deposition conditions.

Sputtering gas: A mixed gas of Ar and $H_2$ ($H_2$ gas concentration: from 1.0 vol % to 80.0 vol %, preferably from 2.0 vol % to 75.0 vol %, more preferably from 3.0 vol % to 70.0 vol %; gas pressure: from $1.0 \times 10^{-1}$ Pa to $50 \times 10^{-1}$ Pa, preferably from $1.0 \times 10^{-1}$ Pa to $40 \times 10^{-1}$ Pa, more preferably from $1.0 \times 10^{-1}$ Pa to $30 \times 10^{-1}$ Pa)

Deposition rate: from 2.0 nm/min to 60.0 nm/min, preferably from 3.5 nm/min to 45.0 nm/min, more preferably from 5.0 nm/min to 30.0 nm/min Input power density per target area: from 0.3 W/cm² to 13.0 W/cm², preferably from 0.6 W/cm² to 12.0 W/cm², more preferably from 1.0 W/cm² to 10.0 W/cm²

Distance between target and substrate: from 50 mm to 500 mm, preferably from 100 mm to 400 mm, more preferably from 150 mm to 300 mm In the case of forming an absorption layer containing Ta, Nb and O by a sputtering method, a sputtering method using a Ta target and an Nb target, or a sputtering method using a target containing Ta and Nb may be conducted in an atmosphere containing an inert gas and $O_2$. In the case of using a magnetron sputtering method, the method may be conducted, specifically, under the following deposition conditions.

Sputtering gas: A mixed gas of Ar and $O_2$ ($O_2$ gas concentration: from 0.5 vol % to 80.0 vol %, preferably from 1.0 vol % to 75.0 vol %, more preferably from 2.0 vol % to 70.0 vol %; gas pressure: from $1.0 \times 10^{-1}$ Pa to $50 \times 10^{-1}$ Pa, preferably from $1.0 \times 10^{-1}$ Pa to $40 \times 10^{-1}$ Pa, more preferably from $1.0 \times 10^{-1}$ Pa to $30 \times 10^{-1}$ Pa)

Input power: from 30 W to 1,000 W, preferably from 50 W to 750 W, more preferably from 80 W to 500 W Deposition rate: from 2.0 nm/min to 60 nm/min, preferably from 3.5 nm/min to 45 nm/min, more preferably from 5 nm/min to 30 nm/min Input power density per target area: from 0.3 W/cm$^2$ to 13.0 W/cm$^2$, preferably from 0.6 W/cm$^2$ to 11.0 W/cm$^2$, more preferably from 1.0 W/cm$^2$ to 9.0 W/cm$^2$ Distance between target and substrate: from 50 mm to 500 mm, preferably from 100 mm to 400 mm, more preferably from 150 mm to 300 mm The absorption layer 14 in the EUV mask blank 1a preferably has a film thickness of 50 nm to 75 nm.

In order to allow a width (flexibility) of the selection for reflectance at a phase difference of 175° to 185°, when the reflectance for light having wavelength of around 13.5 nm at the time of irradiating the surface of the absorption layer 14 with light rays in a wavelength range of EUV light at an incident angle of 6° is defined as the EUV light ray reflectance on the absorption layer surface, and the reflectance for light having wavelength of around 13.5 nm at the time of irradiating the surface of the reflective layer 12 with light rays in a wavelength range of EUV light at an incident angle of 6° is defined as the EUV light ray reflectance on the reflective layer surface, the relative reflectance between the EUV light ray reflectance on the absorption layer surface and the EUV light ray reflectance on the reflective layer surface ((EUV light ray reflectance on absorption layer surface/EUV light ray reflectance on reflective layer surface)×100) is preferably from 2.5% to 15.0%.

It is preferred that the phase difference between reflected light of EUV light from the reflective layer 12 and reflected light of EUV light from the absorption layer 14 is from 175° to 185°, because the effect as a phase shift mask is maximized. However, when the phase difference between reflected light of EUV light from the reflective layer 12 and reflected light of EUV light from the absorption layer 14 is from 150° to 220°, the effect as a phase shift mask can be obtained.

In the EUV mask blank 1a of the present invention, the smoothness of the absorption layer 14 surface is high. Specifically, the surface roughness (rms) of the absorption layer 14 surface is preferably 0.50 nm or less, more preferably 0.40 nm or less, still more preferably 0.30 nm or less. The surface roughness (rms) of the absorption layer 14 surface is preferably 0.01 nm or more, more preferably 0.03 nm or more, still more preferably 0.05 nm or more.

In general, a halftone EUV mask is repeatedly subject to cleaning with a cleaning liquid using an acid, an alkali, etc. in the manufacturing process as well as in use period during exposure.

In the EUV mask blank 1a of the present invention, the absorption layer 14 preferably has high resistance to a cleaning liquid. Specifically, when a SPM resistance test is conducted twice according to the procedure described later in Examples, the amount of reduction in the absorption layer 14 thickness is preferably 0.50 nm or less.

Since the resistance to a cleaning liquid tends to be higher as the denseness of the absorption layer is higher, the density of the absorption layer 14 in the EUV mask blank 1a of the present invention is preferably from 10.0 g/cm$^3$ to 15.0 g/cm$^3$.

Since higher EUV light reflectance and higher transfer accuracy are obtained in a photomask after pattern formation by higher level of flatness, in the EUV mask blank 1a of the present invention, the surface on the side where the absorption layer is formed has a flatness (total bow) of preferably 300 nm or less. The flatness of the EUV mask blank can be measured, for example, using flatness measuring machine manufactured by Fujinon Corporation.

Figure 2:
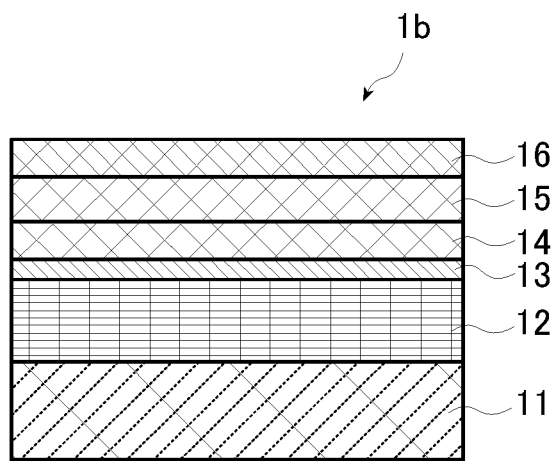
FIG. 2 is a schematic cross-sectional diagram illustrating another embodiment of the EUV mask blank of the present invention.

FIG. 2 is a schematic cross-sectional diagram illustrating another embodiment of the EUV mask blank of the present invention. In the EUV mask blank 1b illustrated in FIG. 2, a reflective layer 12 reflecting EUV light, a protective layer 13 for the reflective layer 12, an absorption layer 14 absorbing EUV light, a low-reflective layer 15 for inspection light used for mask pattern inspection, and a hard mask layer 16 are formed in this order on or above a substrate 11 from the substrate side.

Out of the constituent elements of the EUV mask blank 1b, the substrate 11, the reflective layer 12, the protective layer 13, and the absorption layer 14 are the same as those in the EUV mask blank 1a described above, and their descriptions are omitted.

The low-reflective layer 15 is composed of a film which effects low reflection with respect to inspection light used for inspecting a mask pattern. At the manufacture of an EUV mask, after a pattern is formed in the absorption layer, whether this pattern is formed as designed is inspected. In the inspection of the mask pattern, light having a wavelength of approximately from 190 to 260 nm is usually used as the inspection light. That is, the mask pattern is inspected by a difference in reflectance of light having a wavelength of approximately from 190 to 260 nm, specifically, by a difference in reflectance between an exposed surface from which the absorption layer 14 is removed by pattern formation, and an absorption layer 14 surface remaining without being removed by pattern formation. Here, the former is a reflective layer 12 surface or a protection layer 13 surface. Accordingly, if the difference in reflectance between the reflective layer 12 surface or protective layer 13 surface and the absorption layer 14 surface with respect to the wavelength of the inspection light is small, the contrast at the time of inspection is not good, and accurate inspection cannot be conducted.

From the aspect of the wavelength of inspection light, it is not necessarily true that the light ray reflectance of the absorption layer 14 having the above-described configuration is sufficiently low. Consequently, the difference between the reflectance on the absorption layer 14 surface and the reflectance on the reflective layer 12 surface or protective layer 13 surface at the wavelength of inspection light becomes small, and it is likely that a sufficient contrast is not obtained at the time of inspection. If a sufficient contrast is not obtained at the time of inspection, defects in the pattern cannot be sufficiently detected at the time of mask inspection, and an accurate defect inspection cannot be performed.

In the EUV mask blank 1b of the present invention, when a low-reflective layer 15 with respect to inspection light is formed on the absorption layer 14, the ray reflectance at the wavelength of inspection light is significantly lowered, and the contrast at the time of inspection is improved.

The low-reflective layer 15 is composed of a material whose refractive index at the wavelength of inspection light is lower than that of the absorption layer 14.

In order to achieve the above-described properties, in the EUV mask blank 1b of the present invention, a material containing Ta and O is preferably used as the constituent material of the low-reflective layer 15.

The material containing Ta and O used for the low-reflective layer 15 may contain, in addition to Ta and O, other elements described above. Specific examples of other elements contained in the material, in addition to Ta and O, include Nb, B and N.

In the case of forming a low-reflective layer 15 on the absorption layer 14, the total film thickness of two layers is preferably from 50 nm to 75 nm.

The low-reflective layer 15 having the above-described configuration can be formed by a deposition method, for example, by a magnetron sputtering method or an ion beam sputtering method.

For example, in the case of forming a TaONH film as the low-reflective layer 15 by using a magnetron sputtering method, the film is preferably deposited to have a thickness of 1.5 nm to 30 nm at an input power of 30 W to 3,000 W and a deposition rate of 0.01 nm/min to 60 nm/min by using a Ta target as the target and a mixed gas of Ar and $O_2$ ($H_2$ gas concentration: from 1.0 vol % to 50.0 vol %, $O_2$ gas concentration: from 1.0 vol % to 80.0 vol %, $N_2$ gas concentration: from 1.0 vol % to 80.0 vol %, Ar gas concentration: from 5.0 vol % to 95.0 vol %, gas pressure: from $1.0 \times 10^{-1}$ Pa to $5.0 \times 10^0$ Pa) as the sputtering gas.

In the case of using an inert gas other than Ar, the concentration of the inert gas is set to the same concentration range as the above-described Ar gas concentration.

In the EUV mas blank 1b, when the reflectance for light having wavelength of around 13.5 nm at the time of irradiating the surface of the low-reflective layer 15 with light rays in a wavelength range of EUV light at an incident angle of 6° is defined as the EUV light ray reflectance on the low-reflective layer surface, and the reflectance for light having wavelength of around 13.5 nm at the time of irradiating the surface of the reflective layer 12 with light rays in a wavelength range of EUV light at an incident angle of 6° is defined as the EUV light ray reflectance on the reflective layer surface, the relative reflectance between the EUV light ray reflectance on the low-reflective layer surface and the EUV light ray reflectance on the reflective layer surface ((EUV light ray reflectance on low-reflective layer surface/ EUV light ray reflectance on reflective layer surface)×100) is preferably from 2.5% to 15.0%.

In the EUV mask blank 1b, the phase difference between reflected light of EUV light from the reflective layer 12 and reflected light of EUV light from the low-reflective layer 15 is preferably from 175° to 185°, because the effect as a phase shift mask is sufficiently obtained. However, when the phase difference between reflected light of EUV light from the reflective layer 12 and reflected light of EUV light from the low-reflective layer 15 is from 150° to 220°, the effect as a phase shift mask can be obtained.

In the EUV mask blank 1b of the present invention, the surface roughness (rms) of the low-reflective layer 15 surface is preferably 0.50 nm or less, more preferably 0.40 nm or less, still more preferably 0.30 nm or less. The surface roughness (rms) of the low-reflective layer 15 surface is preferably 0.01 nm or more, more preferably 0.03 nm or more, still more preferably 0.05 nm or more.

In the EUV mask blank 1b of the present invention, the density of the low-reflective layer 15 is preferably from 5.0 g/cm³ to 8.5 g/cm³, more preferably from 5.0 g/cm³ to 8.2 g/cm³.

The reason why a low-reflective layer 15 is preferably formed on the absorption layer 14 in the EUV mask blank 1b of the present invention is that the wavelength of the pattern inspection light and the wavelength of EUV light are different. Accordingly, in the case of using EUV light (wavelength: around 13.5 nm) as the pattern inspection light, it is considered unnecessary to form a low-reflective layer 15 on the absorption layer 14. The wavelength of inspection light tends to shift toward a low wavelength side as the pattern dimension gets smaller, and is expected to shift, in the future, to 193 nm or further to 13.5 nm. In the case where the wavelength of inspection light is 13.5 nm, it is considered unnecessary to form a low-reflective layer 15 on the absorption layer 14.

The hard mask layer 16 is formed on the absorption layer 14, or formed on the low-reflective layer 15 in the case where the low-reflective layer 15 is formed on the absorption layer 14. The hard mask layer 16 is required to have sufficiently high etching selectivity under the etching conditions for the absorption layer 14 and the low-reflective layer 15. In order to meet this requirement, the hard mask layer 16 needs to have sufficient etching resistance to the etching conditions for the absorption layer 14 and the low-reflective layer 15.

As described above, in the case where the absorption layer or low-reflective layer is composed of a material containing Ta, the etching of the absorption layer is executed by performing, in order, dry etching using a fluorine gas and dry etching using an oxygen gas-free chlorine gas. Therefore, the hard mask layer 16 is required to have high etching resistance to dry etching using a fluorine gas and dry etching using an oxygen gas-free chlorine gas.

In order to meet the requirement above, the hard mask layer 16 of the EUV mask blank 1b of the present invention contains chromium (Cr) and at least either one selected from the group consisting of N and O. Specifically, the film includes a CrN film containing Cr and N, a CrO film containing Cr and O, and a CrON film containing Cr, O and N.

The film thickness of the hard mask layer 16 is preferably from 2 nm to 30 nm, more preferably from 2 nm to 25 nm, still more preferably from 2 to 10 nm.

The hard mask layer 16 can be formed by a deposition method, for example, by a sputtering method such as magnetron sputtering method or ion beam sputtering method.

In the case of forming a CrO film by a sputtering method, a sputtering method using a Cr target may be conducted in an atmosphere containing an inert gas including at least one of He, Ar, Ne, Kr and Xe (hereinafter, simply referred to as inert gas) and an $O_2$ gas. In the case of using a magnetron sputtering method, the method may be conducted, specifically, under the following deposition conditions.

Sputtering gas: A mixed gas of Ar and $O_2$ $O_2$ gas concentration: from 15.0 vol % to 100.0 vol %, preferably from 20.0 vol % to 80.0 vol %

Ar gas concentration: from 0.0 vol % to 85.0 vol %, preferably from 20.0 vol % to 80.0 vol %

Gas pressure: from $5.0 \times 10^{-2}$ to $1.0 \times 10^0$ Pa, preferably from $1.0 \times 10^{-1}$ to $8.0 \times 10^{-1}$ Pa, more preferably from $2.0 \times 10^{-1}$ to $4.0 \times 10^{-1}$ Pa Input power density per target area: from 2.0 W/cm² to 13.0 W/cm², preferably from 3.0 W/cm² to 12.0 W/cm², more preferably from 4.0 W/cm² to 10.0 W/cm²

Deposition rate: from 0.010 nm/sec to 0.400 nm/sec, preferably from 0.015 nm/sec to 0.300 nm/sec, more preferably from 0.020 nm/sec to 0.200 nm/sec Distance between target and substrate: from 50 mm to 500 mm, preferably from 100 mm to 400 mm, more preferably from 150 mm to 300 mm In the case of forming a CrN film by a sputtering method, a sputtering method using a Cr target may be conducted in an atmosphere containing an inert gas and $N_2$. In the case of using a magnetron sputtering method, the method may be conducted, specifically, under the following deposition conditions.

Sputtering gas: A mixed gas of Ar and $N_2$
$N_2$ gas concentration: from 15.0 vol % to 100.0 vol %, preferably from 20.0 vol % to 80.0 vol %
Ar gas concentration: from 0.0 vol % to 85.0 vol %, preferably from 20.0 vol % to 80.0 vol %
Gas pressure: from $5.0 \times 10^{-2}$ Pa to $1.0 \times 10^0$ Pa, preferably from $1.0 \times 10^{-1}$ Pa to $8.0 \times 10^{-1}$ Pa, more preferably from $2.0 \times 10^{-1}$ Pa to $4.0 \times 10^{-1}$ Pa
Input power density per target area: from 2.0 W/cm$^2$ to 13.0 W/cm$^2$, preferably from 3.0 W/cm$^2$ to 12.0 W/cm$^2$, more preferably from 4.0 W/cm$^2$ to 10.0 W/cm$^2$ Deposition rate: from 0.010 nm/sec to 0.400 nm/sec, preferably from 0.015 nm/sec to 0.300 nm/sec, more preferably from 0.020 nm/sec to 0.200 nm/sec
Distance between target and substrate: from 50 mm to 500 mm, preferably from 100 mm to 400 mm, more preferably from 150 mm to 300 mm In the case of forming a CrON film by a sputtering method, a sputtering method using a Cr target may be conducted in an atmosphere containing an inert gas, $O_2$ and $N_2$. In the case of using a magnetron sputtering method, the method may be conducted, specifically, under the following deposition conditions.

Sputtering gas: A mixed gas of Ar, $O_2$ and $N_2$
$N_2$ gas concentration: from 14.9 vol % to 99.9 vol %, preferably from 20.0 vol % to 80.0 vol %
$O_2$ gas concentration: from 0.1 vol % to 85.0 vol %, preferably from 0.5 vol % to 80.0 vol %
Ar gas concentration: from 0.0 vol % to 85.0 vol %, preferably from 20.0 vol % to 80.0 vol %
Gas pressure: from $5.0 \times 10^{-2}$ Pa to $1.0 \times 10^0$ Pa, preferably from $1.0 \times 10^{-1}$ Pa to $8.0 \times 10^{-1}$ Pa, more preferably from $2.0 \times 10^{-1}$ Pa to $4.0 \times 10^{-1}$ Pa
Input power density per target area: from 2.0 W/cm$^2$ to 13.0 W/cm$^2$, preferably from 3.0 W/cm$^2$ to 12.0 W/cm$^2$, more preferably from 4.0 W/cm$^2$ to 10.0 W/cm$^2$
Deposition rate: from 0.010 nm/sec to 0.400 nm/sec, preferably from 0.015 nm/sec to 0.300 nm/sec, more preferably from 0.020 nm/sec to 0.200 nm/sec
Distance between target and substrate: from 50 mm to 500 mm, preferably from 100 mm to 400 mm, more preferably from 150 mm to 300 mm In the case of using an inert gas other than Ar, the concentration of the inert gas is set to the same concentration range as the above-described Ar gas concentration. Also, in the case of using a plurality of kinds of inert gases, the total concentration of inert gases is set to the same concentration range as the above-described Ar gas concentration.

In the EUV mask blank 1b of the present invention, the surface where the absorption layer is formed has a flatness (total bow) of preferably 300 nm or less.

The EUV mask blank 1a or 1b of the present invention may have a functional film in the field of EUV mask blanks, in addition to the reflective layer 12, the protective layer 13, the absorption layer 14, the low-reflective layer 15, the hard mask layer 16, and other protective layers formed if desired. Specific examples of such a functional film include a high dielectric coating applied to the back surface side of the substrate so as to promote electrostatic chucking of the substrate, described, for example, in JP-T-2003-501823 (the term "JP-T" as used herein means a published Japanese translation of a PCT patent application). Here, the back surface of the substrate means, in the substrate 11 of FIG. 1, a surface opposite the side where the reflective layer 12 is formed. With respect to the high dielectric coating applied to the back surface of the substrate for such a purpose, the electrical conductivity of the constituent material and the thickness are selected to give a sheet resistance of 100 Ω/sq or less. The constituent material of the high dielectric coating can be selected widely from those described in known literatures. For example, a high dielectric coating described in JP-T-2003-501823, specifically, a coating composed of silicon, TiN, molybdenum, chromium and TaSi, may be applied. The thickness of the high dielectric coating may be, for example, from 10 to 1,000 nm.

The high dielectric coating can be formed using a deposition method, for example, by a sputtering method such as magnetron sputtering method or ion beam sputtering method, a CVD method, a vacuum vapor deposition method, or an electrolytic plating method.

The present invention is described in greater detail below by referring to Examples, however, the present invention is not limited to these Examples. Out of Ex. 1 to Ex. 8, Exs. 1, 6 and 7 are Comparative Examples, and Exs. 2 to 5 and 8 are Examples of the invention.

Ex. 1

In Ex. 1, an EUV mask blank 1a illustrated in FIG. 1 is manufactured.

As the substrate 11 for deposition, a $SiO_2$—$TiO_2$-based glass substrate (outer dimension: 6 inch (152 mm) square, thickness: 6.3 mm) is used. This glass substrate has a coefficient of thermal expansion at 20° C. of $0.02 \times 10^{-7}$/° C., a Young's modulus of 67 GPa, a Poisson's ratio of 0.17 and a specific rigidity of $3.07 \times 10^7$ m$^2$/s$^2$. This glass substrate is polished and thereby formed to have a smooth surface with a surface roughness (rms) of 0.15 nm or less and a flatness of 100 nm or less.

On the back surface side of the substrate 11, a Cr film with a thickness of 100 nm is formed using a magnetron sputtering method to provide a high dielectric coating having a sheet resistance of 100 Ω/sq.

The substrate 11 (outer dimension: 6 inch (152 mm) square, thickness: 6.3 mm) is fixed to a flat plate-shaped usual electrostatic chuck via the formed Cr film, and an operation of alternately depositing a Si film and a Mo film on the surface of the substrate 11 by using an ion beam sputtering method is repeated for 40 cycles to thereby form a Si/Mo multilayer reflective film (reflective layer 12) having a total film thickness of 272 nm ((4.5 nm+2.3 nm)×40).

Furthermore, a Ru film (film thickness: 2.5 nm) is deposited on the Si/Mo multilayer reflective film (reflective layer 12) by using an ion beam sputtering method to form a protective layer 13.

The deposition conditions for the Si film, Mo film and Ru film are as follows.
Deposition Conditions for Si Film
  Target: Si target (boron-doped)
  Sputtering gas: Ar gas (gas pressure: $2.0 \times 10^{-2}$ Pa)
  Voltage: 700 V
  Deposition rate: 0.077 nm/sec
  Film thickness: 4.5 nm
Deposition Conditions for Mo Film
  Target: Mo target
  Sputtering gas: Ar gas (gas pressure: $2.0 \times 10^{-2}$ Pa)
  Voltage: 700 V
  Deposition rate: 0.064 nm/sec
  Film thickness: 2.3 nm Deposition Conditions for Ru Film
　Target: Ru target
　Sputtering gas: Ar gas (gas pressure: $2.0 \times 10^{-2}$ Pa)
　Voltage: 500 V
　Deposition rate: 0.023 nm/sec
　Film thickness: 2.5 nm Next, an absorption layer 14 (TaNb film) containing Ta and Nb is formed on the protective layer by using a magnetron sputtering method. The deposition conditions for the absorption layer 14 are as follows.

Deposition Conditions for Absorption Layer 14 (TaNb Film)
　Target: Ta target, Nb target
　Sputtering gas: Ar gas (gas pressure: $4.0 \times 10^{-1}$ Pa)
　Input power density per Ta target area: 8.0 W/cm$^2$
　Distance between Ta target and substrate: 300 mm
　Input power density per Nb target area: 5.8 W/cm$^2$
　Distance between Nb target and substrate: 300 mm
　Deposition rate: 5.0 nm/min
　Film thickness: 59 nm With respect to the EUV mask blank 1a obtained according to the procedure above, the following evaluations (1) to (7) are conducted. In the following evaluations (1) to (7), the same evaluation results are obtained also in a mask blank where the absorption layer (TaNb film) is deposited on a silicon wafer.

(1) Film Composition

The composition of the absorption layer (TaNb film) is measured using Rutherford Back Scattering Spectroscopy (manufactured by Kobe Steel, Ltd.). The composition ratio (at %) of the absorption layer (TaNb film) is Ta:Nb=65.0:35.0.

In this Example, the composition ratio of the absorption layer is measured using a Rutherford back scattering spectroscopy, but the composition ratio can also be measured by other measuring methods such as X-ray photoelectric spectroscopy (XPS) and energy dispersive X-ray analysis (EDX).

(2) Film Thickness and Film Density

The film thickness and film density of the absorption layer (TaNb film) are measured using X-ray Reflectometry (XRR).

(3) Calculation of Phase Difference and Relative Reflectance in EUV Wavelength Range The phase difference between reflected light of EUV light from the reflective layer 12 and reflected light of EUV light from the absorption layer 14, and the relative reflectance between EUV light ray reflectance on the absorption layer 14 surface and EUV light ray reflectance on the reflective layer 12 surface are determined by optical simulation. As to the optical constants of the reflective layer necessary for the simulation, the values of data base of Center for X-Ray Optics, Lawrence Berkeley National Laboratory are used. In addition, as to the optical constants of the absorption layer, values evaluated by measuring the "angle dependency" of the reflectance in a 13.5 nm range are used.

Specifically, the EUV reflectance, incident angle of EUV light, and optical constant are represented by the following formula:

$$R = |(\sin\theta - ((n+ik)^2 - \cos^2\theta)^{1/2})/(\sin\theta + ((n+ik)^2 - \cos^2\theta)^{1/2})|$$

In the formula above, θ is an incident angle of EUV light, R is an EUV reflectance at an incident angle θ, n is a refractive index of the absorption layer, and k is an extinction coefficient of the absorption layer. The EUV optical constants ((refractive index (n) and extinction coefficient (k)) can be estimated by fitting measured values of the reflectance at respective EUV incident angles with use of the formula above.

(4) Crystal Peak Derived from Absorption Layer

With respect to the absorption layer (TaNb film), measurement by the out-of-plane XRD method is conducted. The half width FWHM of the peak having highest intensity among diffraction peaks derived from the absorption layer observed at 2θ: from 20° to 50° is determined.

(5) SPM Resistance

The absorption layer (TaNb film) is immersed in SPM (sulfuric acid/hydrogen peroxide mixture, sulfuric acid:hydrogen peroxide=3:1) at 100° C. for 20 minutes and then rinsed with pure water. The film thickness is measured before and after the immersion in SPM, and the change in film thickness before and after the immersion is determined. In the Table below, the positive numerical value indicates a decrease in the film thickness, and a negative numerical value indicates an increase in the film thickness.

The SPM resistance test is conducted twice.

(6) Surface Roughness (rms)

The surface roughness (rms) on the absorption layer (TaNb film) surface is measured using Atomic Force Microscope. The surface roughness (rms) can be also measured based on JIS-B0601-2001.

(7) Cl$_2$ Etching Rate

A sample where the absorption layer (TaNb film) is formed is placed on a sample table of an ICP (inductively coupled) plasma etching apparatus and subjected to ICP plasma etching under the following conditions to determine the etching rate.
　ICP Antenna bias: 200 W
　Substrate bias: 40 W
　Etching time: 30 sec
　Trigger pressure: $5.0 \times 10^0$ Pa
　Etching pressure: $3.0 \times 10^{-1}$ Pa
　Etching gas: Cl$_2$/He
　Gas flow rate (Cl$_2$/He): 4/16 sccm Ex. 2

Ex. 2 is conducted according to the same procedure as in Ex. 1 except that an absorption layer (TaNbB film) containing Ta, Nb and B is deposited as the absorption layer 14 under the following conditions.

Deposition Conditions for Absorption Layer (TaNbB Film)
　Target: TaB (Ta:B=60:40) target, Nb target
　Sputtering gas: Ar gas (gas pressure: $2.2 \times 10^{-1}$ Pa)
　Input power density per TaB target area: 6.4 W/cm$^2$
　Distance between TaB target and substrate: 150 mm
　Input power density per Nb target area: 4.7 W/cm$^2$
　Distance between Nb target and substrate: 150 mm
　Deposition rate: 14.0 nm/min
　Film thickness: 59 nm Ex. 3

Ex. 3 is conducted according to the same procedure as in Ex. 1 except that an absorption layer (TaNbB film) containing Ta, Nb and B is deposited as the absorption layer 14 under the following conditions.

Deposition Conditions for Absorption Layer (TaNbB Film)
　Target: TaB (Ta:B=60:40) target, Nb target
　Sputtering gas: Ar gas (gas pressure: $2.2 \times 10^{-1}$ Pa)
　Input power density per TaB target area: 9.9 W/cm$^2$
　Distance between TaB target and substrate: 150 mm Input power density per Nb target area: 2.5 W/cm²
Distance between Nb target and substrate: 150 mm
Deposition rate: 7.6 nm/min
Film thickness: 59 nm Ex. 4

Ex. 4 is conducted according to the same procedure as in Ex. 1 except that an absorption layer (TaNbN film) containing Ta, Nb and N is deposited as the absorption layer 14 under the following conditions.
Deposition Conditions for Absorption Layer (TaNbN Film)
  Target: Ta target, Nb target
  Sputtering gas: A mixed gas of Ar and $N_2$ (Ar: 96.2 vol %, $N_2$: 3.8 vol %, gas pressure: $2.2 \times 10^{-1}$ Pa)
  Input power density per Ta target area: 9.9 W/cm²
  Distance between Ta target and substrate: 150 mm
  Input power density per Nb target area: 7.4 W/cm²
  Distance between Nb target and substrate: 150 mm
  Deposition rate: 24.8 nm/min
  Film thickness: 59 nm Ex. 5

Ex. 5 is conducted according to the same procedure as in Ex. 1 except that an absorption layer (TaNbN film) containing Ta, Nb and N is deposited as the absorption layer 14 under the following conditions.
Deposition Conditions for Absorption Layer (TaNbN Film)
  Target: Ta target, Nb target
  Sputtering gas: A mixed gas of Ar and $N_2$ (Ar: 90.0 vol %, $N_2$: 10.0 vol %, gas pressure: $2.2 \times 10^{-1}$ Pa)
  Input power density per Ta target area: 9.9 W/cm²
  Distance between Ta target and substrate: 150 mm
  Input power density per Nb target area: 7.4 W/cm²
  Distance between Nb target and substrate: 150 mm
  Deposition rate: 26.9 nm/min
  Film thickness: 59 nm Ex. 6

Ex. 6 is conducted according to the same procedure as in Ex. 1 except that an absorption layer (TaN film) containing Ta and N is deposited as the absorption layer 14 under the following conditions.
Deposition conditions for Absorption Layer (TaN Film)
  Target: Ta target
  Sputtering gas: A mixed gas of Ar, Kr and $N_2$ (Ar: 43.0 vol %, Kr: 43.0 vol %, $N_2$: 14.0 vol %, gas pressure: $2.6 \times 10^{-1}$ Pa)
  Input power density per target area: 9.9 W/cm²
  Distance between target and substrate: 150 mm
  Deposition rate: 14.2 nm/min
  Film thickness: 60 nm Ex. 7

Ex. 7 is conducted according to the same procedure as in Ex. 1 except that an absorption layer (TaBN film) containing Ta, B and N is deposited as the absorption layer 14.
Deposition Conditions for Absorption Layer (TaBN Film)
  Target: TaB (Ta:B=60:40) target
  Sputtering gas: A mixed gas of Ar and $N_2$ (Ar: 80.0 vol %, $N_2$: 20.0 vol %, gas pressure: $2.2 \times 10^{-1}$ Pa)
  Input power density per target area: 9.9 W/cm²
  Distance between target and substrate: 150 mm
  Deposition rate: 14.4 nm/min
  Film thickness: 60 nm Ex. 8

Ex. 8 is conducted according to the same procedure as in Ex. 1 except that an absorption layer (TaNbO film) containing Ta, Nb and O is deposited as the absorption layer 14.
Deposition Conditions for Absorption Layer (TaNbO Film)
  Target: Ta target, Nb target
  Sputtering gas: A mixed gas of Ar and $O_2$ (Ar: 97.9 vol %, $O_2$: 2.1 vol %, gas pressure: $2.2 \times 10^{-1}$ Pa)
  Input power density per Ta target area: 9.9 W/cm²
  Distance between Ta target and substrate: 150 mm
  Input power density per Nb target area: 8.9 W/cm²
  Distance between Nb target and substrate: 150 mm
  Deposition rate: 18.8 nm/min
  Film thickness: 59 nm

TABLE 1

|  |  | Film Composition (at %, RBS) | | | | | Film Thickness | Film Density (XRR) |
| --- | --- | --- | --- | --- | --- | --- | --- | --- |
|  |  | Ta | Nb | O | N | B | nm | g/cm³ |
| Ex. 1 | TaNb film | 65.0 | 35.0 |  |  |  | 59 | 13.7 |
| Ex. 2 | TaNbB film | 58.7 | 30.1 |  |  | 11.2 | 59 | 13.2 |
| Ex. 3 | TaNbB film | 51.4 | 23.4 |  |  | 25.3 | 59 | 12.3 |
| Ex. 4 | TaNbN film | 47.3 | 29.0 |  | 23.7 |  | 59 | 12.8 |
| Ex. 5 | TaNbN film | 39.0 | 23.8 |  | 37.2 |  | 59 | 13.1 |
| Ex. 6 | TaN film | 80.0 |  |  | 20.0 |  | 60 | 14.5 |
| Ex. 7 | TaBN film | 60.0 |  |  | 20.0 | 20.0 | 60 | 12.8 |
| Ex. 8 | TaNbO film | 58.5 | 33.1 | 8.4 |  |  | 59 | 12.8 |

TABLE 2

|  | EUV Optical Constants | | Phase Difference and Relative Reflectance in EUV Wavelength Range | | Crystallinity (out-of-plane XRD) |
| --- | --- | --- | --- | --- | --- |
|  | n | k | Phase Difference (°) | Relative Reflectance (%) | Half Width (FWHM, °) |
| Ex. 1 | 0.952 | 0.024 | 161.1 | 6.8 | 0.4 |
| Ex. 2 | 0.954 | 0.023 | 154.1 | 7.4 | 4.8 |
| Ex. 3 | 0.955 | 0.022 | 150.4 | 8.2 | 6.3 |
| Ex. 4 | 0.950 | 0.027 | 169.1 | 5.0 | 2.9 |
| Ex. 5 | 0.946 | 0.026 | 180.9 | 6.1 | 3.0 |
| Ex. 6 | 0.948 | 0.033 | 182.6 | 1.7 | 4.3 |
| Ex. 7 | 0.951 | 0.031 | 169.0 | 2.0 | 6.6 |
| Ex. 8 | 0.954 | 0.022 | 153.7 | 8.3 | 1.2 |

TABLE 3

|  |  | SPM Resistance (nm) | | Surface Roughness (AFM, rms, nm) | Etching Rate (Cl$_2$, nm/min) |
|---|---|---|---|---|---|
|  |  | First Time | Second Time |  |  |
| Ex. 1 | TaNb film | −0.12 | −0.03 | 0.67 | 238 |
| Ex. 2 | TaNbB film | 0.05 | 0.24 | 0.15 | 220 |
| Ex. 3 | TaNbB film | 0.29 | 1.41 | 0.12 | 200 |
| Ex. 4 | TaNbN film | −0.09 | 0.04 | 0.17 | 170 |
| Ex. 5 | TaNbN film | 0.69 | 1.50 | 0.13 | 158 |
| Ex. 6 | TaN film | 0.00 | −0.05 | 0.38 | 110 |
| Ex. 7 | TaBN film | 0.34 | 0.51 | 0.23 | 153 |
| Ex. 8 | TaNbO film | −0.94 | −0.84 | 0.15 | 186 |

In Ex. 1 where the half width FWHM is less than 1.0°, the surface roughness on the absorption layer surface is more than 0.50 nm. In Exs. 2 to 5 and 8 where the half width FWHM is 1.0° or more, the surface roughness on the absorption layer surface is 0.50 nm or less.

In Exs. 2, 4 and 8 where the contents of B, N and O in the absorption layer 14 are predetermined range, the SPM resistance is excellent. In Ex. 7 where the film is TaBN film, the SPM resistance is poor.

In Ex. 6 where the film is TaN film and in Ex. 7 where the film is TaBN film, the relative reflectance between the EUV light ray reflectance on the absorption layer 14 surface and the EUV light ray reflectance on the reflective layer 12 surface is too low, i.e., less than 2.5%, and therefore, the films are unsuitable as the absorption layer of a halftone EUV mask.

While the present invention has been described in detail and with reference to specific embodiments thereof, it will be apparent to one skilled in the art that various changes and modifications can be made therein without departing from the spirit and scope thereof 1: EUV Mask blank
11: Substrate
12: Reflective layer (multilayer reflective film)
13: Protective layer
14: Absorption layer
15: Low reflective layer
16: Hard mask layer

The invention claimed is:

1. A reflective mask blank for EUV lithography, comprising a substrate, a reflective layer for reflecting EUV light, and an absorption layer for absorbing EUV light, the reflective layer and the absorption layer formed on or above the substrate in this order,
wherein the absorption layer comprises tantalum (Ta) and niobium (Nb), and the absorption layer has a composition ratio Ta:Nb of Ta (at %) to Nb (at %) of from 4:1 to 1:4, and
wherein among diffraction peaks derived from the absorption layer observed at 2θ: from 20° to 50° by out-of-plane XRD method, a peak having the highest intensity has a half width FWHM of 1.0° or more.

2. The reflective mask blank for EUV lithography according to claim 1, wherein the absorption layer further comprises at least one selected from the group consisting of hydrogen (H), boron (B), nitrogen (N), and oxygen (O).

3. The reflective mask blank for EUV lithography according to claim 2, wherein the absorption layer comprises from 5.0 at % to 20.0 at % of boron.

4. The reflective mask blank for EUV lithography according to claim 2, wherein the absorption layer comprises from 10.0 at % to 35.0 at % of nitrogen.

5. The reflective mask blank for EUV lithography according to claim 2, wherein the absorption layer comprises from 0.1 at % to 15.0 at % of hydrogen.

6. The reflective mask blank for EUV lithography according to claim 2, wherein the absorption layer comprises from 1.0 at % to 20.0 at % of oxygen.

7. The reflective mask blank for EUV lithography according to claim 1, wherein the absorption layer has a refractive index for EUV light of from 0.935 to 0.963 and an extinction coefficient for EUV light of from 0.008 to 0.030.

8. The reflective mask blank for EUV lithography according to claim 1,
wherein a phase difference between a reflected light of EUV light from the reflective layer and a reflected light of EUV light from the absorption layer is from 150° to 220°, and
wherein a relative reflectance between an EUV light ray reflectance on a surface of the absorption layer and an EUV light ray reflectance on a surface of the reflective layer surface ((EUV light ray reflectance on absorption layer surface/EUV light ray reflectance on reflective layer surface)×100) is from 2.5% to 15.0%.

9. The reflective mask blank for EUV lithography according to claim 1, wherein the absorption layer has a surface roughness (rms) of 0.50 nm or less.

10. The reflective mask blank for EUV lithography according to claim 1, comprising a hard mask layer on the absorption layer, wherein the hard mask layer comprises chromium (Cr) and at least one selected from the group consisting of nitrogen (N) and oxygen (O).

11. The reflective mask blank for EUV lithography according to claim 1, comprising, on the absorption layer, a low-reflective layer with respect to an inspection light having a wavelength of from 190 nm to 260 nm for a mask pattern, wherein the low-reflective layer comprises tantalum (Ta) and oxygen (O).

12. The reflective mask blank for EUV lithography according to claim 11, wherein a total film thickness of the absorption layer and the low-reflective layer is from 50 nm to 75 nm.

13. The reflective mask blank for EUV lithography according to claim 11, wherein the absorption layer has a density of from 10.0 g/cm$^3$ to 15.0 g/cm$^3$, and the low-reflective layer has a density of from 5.0 g/cm$^3$ to 8.2 g/cm$^3$.

14. The reflective mask blank for EUV lithography according to claim 11,
wherein a relative reflectance between a reflected light of EUV light from the reflective layer and a reflected light of EUV light from the low-reflective layer is from 150° to 220°, and
wherein an EUV light ray reflectance on a surface of the low-reflective layer and an EUV light ray reflectance on a surface of the reflective layer surface ((EUV light ray reflectance on low-reflective layer surface/EUV light ray reflectance on reflective layer surface)×100) is from 2.5% to 15.0%.

15. The reflective mask blank for EUV lithography according to claim 11, wherein the low-reflective layer has a surface roughness (rms) of 0.50 nm or less.

16. The reflective mask blank for EUV lithography according to claim 11, comprising a hard mask layer on the low-reflective layer, wherein the hard mask layer comprises chromium (Cr) and at least one selected from the group consisting of nitrogen (N) and oxygen (O).

17. The reflective mask blank for EUV lithography according to claim 1, wherein a surface where the absorption layer is formed has a flatness of 300 nm or less.

\* \* \* \* \*